United States Patent
Licata et al.

(10) Patent No.: US 6,508,919 B1
(45) Date of Patent: Jan. 21, 2003

(54) OPTIMIZED LINERS FOR DUAL DAMASCENE METAL WIRING

(75) Inventors: Thomas J. Licata, Mesa, AZ (US); Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/723,874

(22) Filed: Nov. 28, 2000

(51) Int. Cl.⁷ ................... C23C 14/34; H01L 29/06; H01L 39/00; B05D 5/12
(52) U.S. Cl. ................... 204/192.22; 204/192.17; 257/9; 257/30; 427/97; 438/627
(58) Field of Search ................... 204/192.17, 192.22; 438/648, 653, 656, 582, 627, 628, 643, 644, 629; 427/80, 97, 99; 257/9, 30, 35

(56) References Cited

U.S. PATENT DOCUMENTS

| | | | | |
|---|---|---|---|---|
| 5,610,106 A | * | 3/1997 | Foster et al. | 438/680 |
| 5,665,978 A | * | 9/1997 | Uenoyama et al. | 257/30 |
| 5,702,976 A | * | 12/1997 | Scheugraf et al. | 428/424 |
| 5,719,447 A | * | 2/1998 | Gardner | 257/762 |
| 5,739,579 A | * | 4/1998 | Chiang et al. | 257/635 |
| 5,973,371 A | * | 10/1999 | Kasai | 257/382 |
| 6,085,690 A | * | 7/2000 | Mizuno | 118/723 E |
| 6,139,697 A | * | 10/2000 | Chen et al. | 204/192.15 |
| 6,189,209 B1 | * | 2/2001 | Saran | 257/751 |
| 6,284,646 B1 | * | 9/2001 | Leem | 438/629 |
| 6,342,448 B1 | * | 1/2002 | Lin et al. | 438/595 |
| 6,355,558 B1 | * | 3/2002 | Dixit et al. | 438/642 |

FOREIGN PATENT DOCUMENTS

WO   WO 99/33110   * 7/1999

* cited by examiner

Primary Examiner—Patrick Ryan
Assistant Examiner—Gregg Cantelmo
(74) Attorney, Agent, or Firm—Wood, Herron & Evans, LLP

(57) ABSTRACT

A method of forming diffusion barrier stacks on a dielectric for a dual damascene metal chip-level interconnect, and a diffusion barrier stack produced thereby. Alternating layers of a metal and an electrically resistive diffusion barrier are deposited on a dielectric substrate, with different layers having different thicknesses appropriate to their functions in the device. In an example of the present invention, alternating layers of tantalum and tantalum nitride are deposited on a dielectric substrate.

61 Claims, No Drawings

OPTIMIZED LINERS FOR DUAL DAMASCENE METAL WIRING

FIELD OF THE INVENTION

This invention relates to the formation of liner films for dual damascene metal chip-level interconnects.

BACKGROUND OF THE INVENTION

In a conventional dual damascene metal process, thin liners, such as refractory liners, are sputtered into a recessed feature, which is then coated with a thicker and more conductive film, such as copper, that can carry current during device operation.

In the case of Cu interconnects with a $SiO_2$ dielectric, for example, a first metal liner film, such as Ta or Ti, may be applied to provide adhesion, low contact resistance, and reduced contamination of the surrounding dielectric by the subsequently deposited overlying interconnect film or structure. A second metal nitride liner film such as TaN, TiN or $WN_x$ may be applied thereon to improve the barrier performance. The next film, such as a Cu seed, is applied to facilitate the interconnect structure formation, for example electroplated Cu fill. Finally, the wafer is transferred to another apparatus that accomplishes the interconnect structure formation.

For the case of Cu interconnects with a fluorinated dielectric, the Ta or Ti deposition step is omitted, and the metal nitride is deposited directly onto the dielectric, since a pure metal, such as Ta or Ti, can react with fluorine to form compounds that render the interface between the dielectric and liner film weak against film delamination. This would be equally true for other mobile reactive species that may be present in a dielectric.

Liner films are commonly deposited by conventional physical vapor deposition (PVD), which results in a poor coverage ratio for the recessed surface features, such as contacts, trenches and vias, versus the upper surfaces of the wafer. This is particularly true for high aspect ratio features. Ionized PVD and chemical vapor deposition (CVD) have been developed, which provide films having different characteristics than those resulting from conventional PVD. In particular, ionized PVD greatly enhances coverage of the feature bottom and enhances sidewall coverage. In general, as is well known in the art, ionized PVD involves sputtering particles from a source and converting the particles to positive ions by a high density plasma and applying an electric field, or bias, to direct the ions into the recessed features through a potential difference. There are numerous apparatuses available to one skilled in the art for performing ionized PVD, one example of which is discussed in copending application Ser. No. 09/442,600, now U.S. Pat. No. 6,287,435, entitled "Method and Apparatus for Ionized Physical Vapor Deposition," and incorporated by reference herein.

CVD can also be used to deposit films. Such films cover features differently than do PVD films. CVD processes use reactive precursors, which may contain a halogen, such as fluorine or chlorine. The precursors diffuse to the substrate surface where they react and leave a metal-containing film behind. The reaction can occur through either thermal or plasma-enhanced mechanisms. Thermal CVD can provide uniform coverage of an entire feature. In general, as is well known in the art, thermal CVD is a high temperature process in which the reactive precursors are passed over a heated substrate, and they readily decompose in the high temperature environment of the reactor and recombine to form a conformal metal-containing film on the heated substrate. Plasma enhanced CVD provides coverage similar to that provided by ionized PVD though with less overhang near the feature opening. Plasma enhanced CVD introduces a plasma to produce reactive chemical species from the reactive precursors, which combine to deposit the desired film on the surface of the substrate. The energetic enhancement provided by plasma enhanced CVD allows layers to be deposited at a significantly lower temperature than those deposited by unassisted thermal CVD methods. There are numerous apparatuses available to one skilled in the art for performing thermal and/or plasma enhanced CVD, one example of which is discussed in copending application Ser. No. 09/300,632 entitled "CVD of Integrated Ta and $TaN_x$ Films from Tantalum Halide Precursors," now U.S Pat. No. 6,410,432 issued Jun. 25, 2002, incorporated by reference herein.

Typically, electrically conductive refractory metal nitrides such as $Ta_2N$, TaSiN, TiN, $WN_x$ and WSiN can be employed as a diffusion barrier to prevent migration of foreign particles into the dielectric or the semiconductor substrate beneath the wiring. At typical process temperatures up to about 450° C., such films are moderately conductive, are stable against thermal degradation and chemical reactions, and effectively block the unwanted migration of atoms if the film thickness is sufficient at all points along the feature. However, diffusion barrier film thickness should be minimized everywhere to allow more room for conductive copper fill or other conductive metal fill and easy removal from the upper surface by chemical mechanical polishing (CMP), but particularly at the feature bottom to achieve desirable low contact resistance for the device. In practice, the product of the film resistivity and thickness must be engineered to allow device contact resistance specifications of, for example, about 2–4 Ohms per contact for a 0.1 $\mu$m IC product node. Thus, a balance must be struck between having enough diffusion barrier material to block the passage of diffusing atoms from the metal layer, the dielectric and the interconnect metal, and having a thin enough layer to permit good electrical contact and cost-effective manufacturing.

The problem of high contact resistance is more severe for more highly resistive metal nitrides including amorphous ternary compounds such as TaSiN and WSiN, amorphous TaN, and for insulating diffusion barriers such as $Si_3N_4$, all of which provide exceptionally robust diffusion barrier properties.

With all of the various methods in existence for forming various layers on a wafer, a need exists to establish an effective method for forming the liners for dual damascene wiring.

SUMMARY OF THE INVENTION

The present invention provides a diffusion barrier stack integral with a dielectric for use in an interconnect structure, the dielectric topography having surface features, such as contacts, trenches and vias, and a method for forming the diffusion barrier stacks on the dielectric, the method including depositing alternating layers of a metal and an electrically resistive diffusion barrier, such as a metal nitride or an insulating silicon nitride. Each layer has a thickness sufficient to perform a desired function in the structure. The internal metal layers have a thickness sufficient to function as contact facilitation layers. The electrically resistive diffusion barrier layers have individual layer thicknesses sufficient to allow passage of current through the layer and a total thickness of all diffusion barrier layers sufficient to block passage of diffusing atoms. The terminal layer of the stack functions as an interconnect metal stabilization layer.

DETAILED DESCRIPTION OF THE INVENTION

The present invention combines various coating techniques to create an optimized liner that provides advantages over conventional liner integration schemes. To this end, and in accordance with the present invention, the metal-based liner films for a dual damascene metal chip-level interconnect are composed of one or more stacks of metal and electrically resistive diffusion barrier, such as metal nitride films or insulators, with different films having different thicknesses appropriate to their functions in the device. A wide plating process window is provided by promoting formation of an interconnect metal seed layer that is morphologically stable, and that does not excessively overhang feature openings. Good diffusion barrier properties are provided by utilizing a robust barrier material and by ensuring that sufficient barrier coverage is maintained along the entire feature surface. Good contact resistance is provided by distributing the barrier film thickness among at least one serial layer that is thin enough, and spaced by metal, to allow the passage of electrical current by direct conduction or tunneling. Good adhesion is provided by choosing a first liner film, and hence deposition sequence, that does not result in undesirable byproduct formation at the dielectric-liner interface. CMP is facilitated by the enhanced conformality that results in less barrier thickness on the copper surface for a given amount of coverage on the sidewall. In an embodiment of the present invention, all liner and seed films are deposited using the same vacuum platform thereby preventing exposure of the wafer to contaminants between the film depositions. In another embodiment, all liner films are deposited within the same deposition chamber using a serial CVD processing technique.

In a first example of an embodiment of the present invention, a TaN/Ta/TaN/Ta diffusion barrier stack is integrated with a fluorinated dielectric. Because the dielectric is fluorinated, the first liner layer is either a metal nitride or insulating material so as to avoid byproduct formation at the dielectric-liner interface. In this first example, the diffusion barrier material is TaN, and the metal is Ta. By way of example only, it is assumed that approximately 50 Å total barrier thickness is required, particularly on feature sidewalls, to achieve good diffusion barrier properties, and that tunneling current cannot pass through an individual TaN film layer having a thickness greater than about 25 Å. If a different total diffusion barrier thickness is required, then the layers of the liner stack may be scaled accordingly. Further, if the current is insufficient through a given barrier layer thickness, then the individual barrier layer thicknesses can be reduced, and an additional barrier/metal series added to the stack beneath the terminal metal layer to regain the barrier performance. The intermediate metal layers should be thick enough at the bottom of recessed surface features, such as contacts, trenches and vias, to form metal-like electrical states to facilitate tunneling through the adjacent resistive films to thereby function as a contact facilitation layer. The terminal metal layer, which may be either the diffusion barrier or the metal, should be thick enough on the sidewalls and bottom of the features to function as an interconnect metal stabilization layer. If it is not thick enough, the morphology of the interconnect film may be poor. By way of example only, a metal terminal layer is at least about 20 Å. It may, however, be as thin as a monolayer or several monolayers if good morphology can be obtained. In one embodiment of the present invention, the sidewall thickness of the terminal layer is about 25–50 Å.

To accomplish the integration goals in this first example of the present invention, the films for a wafer feature should have the following liner stack arrangement and approximate layer thicknesses at the locations indicated:

TABLE 1

| Thickness and Material | Location of Thickness | Deposition Order | Function of Film |
|---|---|---|---|
| 20Å Ta | Sidewall | Film 4 | Interconnect Stabilization Layer |
| 25Å TaN | Sidewall | Film 3 | Serial Diffusion Barrier |
| 15Å Ta | Bottom | Film 2 | Contact Facilitation Layer |
| 25Å TaN | Sidewall | Film 1 | Serial Diffusion Barrier |
| Fluorinated Dielectric | — | Substrate | — |

To achieve these coverages as described in Table 1 where they are most needed, while still facilitating electroplate fill and CMP, or other interconnect formation techniques, it is effective to use a combination of thermal and plasma process techniques. For plasma enhanced CVD of Ta, approximately 8% sidewall coverage is obtained, while thermal CVD of TaN exhibits approximately 90% sidewall coverage. However, plasma enhanced CVD of Ta provides 40% bottom coverage and the thermal CVD of TaN provides about 90% bottom coverage. For purposes of this discussion, step coverage is defined as the ratio (times 100) of the coating thickness at the sidewall of a feature (at the thinnest point along the sidewall) or at the bottom of a feature to the coating thickness on the upper surface adjacent the feature. Thus, for the above film sequence using plasma enhanced CVD to deposit the Ta layers and thermal CVD to deposit the TaN layers, the wafer will have the following coverages and thicknesses of deposited films:

TABLE 2

| Film | Material | Sidewall Coverage | Sidewall Thickness (Å) | Bottom Coverage | Bottom Thickness (Å) | Upper Surface Thickness (Å) |
|---|---|---|---|---|---|---|
| 4 | PECVD Ta | 8% | 20 | 40% | 100 | 250 |
| 3 | Thermal TaN | 90% | 25 | 90% | 25 | 28 |
| 2 | PECVD Ta | 8% | 3 | 40% | 15 | 38 |
| 1 | Thermal TaN | 90% | 25 | 90% | 25 | 28 |
| Totals | | | 73 | | 165 | 344 |

The sidewall step coverage is about 21%, while the bottom step coverage is about 48%. The thickness of Film 2, which is a metal interlayer, is determined from the contact resistance requirement. Film 2 needs to be thick enough to establish a conductive layer at the bottom contact between the two TaN layers so that there are metal electronic states to tunnel to and from. For this purpose, about 5–20 Å should be a sufficient metal thickness at the bottom of the feature. Because the bottom coverage for plasma enhanced CVD of tantalum in a contact hole having an aspect ratio of about 5 is approximately 40%, 15 Å Ta at the feature bottom provides a corresponding 38 Å at the upper surface of the substrate and 3 Å on the sidewalls of the feature. Thus, the upper surface film thicknesses are about 25 Å TaN/38 Å Ta/25 Å TaN/250 Å Ta, and the conformality of this stack is about 21%, as calculated by the sum of the approximate sidewall film thicknesses (25+3+25+20) divided by the sum of the upper surface approximate film thicknesses (28+38+28+250). This is approximately two times better than conventional ionized PVD processing.

In a second example of an embodiment of the present invention, a dielectric is used that does not liberate fluorine, for example organosilicate glass (OSG) or SILK® (Dow Chemical Corp). Again, TaN is used as the diffusion barrier material and Ta as the metal. The film stack consists of about 38 Å Ta/28 Å TaN/250 Å Ta on the upper surface of the dielectric substrate. Where the tantalum is deposited by plasma enhanced CVD and the tantalum nitride by thermal CVD, the sidewall films have corresponding thicknesses of about 3 Å Ta/25 Å TaN/20 Å Ta. The first Ta layer, which functions as a contact facilitation layer, has a feature bottom thickness of about 15 Å. The sidewall step coverage and conformality of the stack is about 15%, and the bottom step coverage is about 44%. This example is further presented in Table 3.

In comparison to the previous example, due to a non-fluorinated dielectric substrate, the first film of a metal nitride diffusion barrier was eliminated and the tantalum layer deposited directly onto the dielectric. The result is about 25 Å of metal nitride diffusion barrier material to block diffusing atoms, and a diffusion barrier layer thin enough to permit tunneling conduction. It should be understood, however, that when a non-fluorinated substrate is used, either a metal or diffusion barrier may be deposited as the first liner layer. It should be further understood that if a fluorinated substrate is used, but the dielectric is treated in some way to render the fluorine non-reactive with a refractory metal, then the refractory metal may be deposited as the first liner layer. These principles apply equally to dielectrics that may have reactive species other than fluorine.

In yet another example of an embodiment of the present invention, an additional barrier/metal series is added to the previous embodiment. The film stack consists of about 38 Å Ta/28 Å TaN/38 Å Ta/28 Å TaN/250 Å Ta on the upper surface of the non-fluorinated dielectric substrate. The feature sidewalls have a corresponding thickness of about 3 Å Ta/25 Å TaN/3 Å Ta/25 Å TaN/20 Å Ta, and the conformality and sidewall step coverage of the film stack is about 20%. The bottom step coverage is about 48%. This example is further presented in Table 4. The additional barrier/metal series increases the total diffusion barrier material and the conformality and step coverage of the stack, while maintaining individual barrier layers at a thickness that allows the tunneling current to pass through.

TABLE 3

| Film | Material | Sidewall Coverage | Sidewall Thickness (Å) | Bottom Coverage | Bottom Thickness (Å) | Upper Surface Thickness (Å) |
|---|---|---|---|---|---|---|
| 3 | PECVD Ta | 8% | 20 | 40% | 100 | 250 |
| 2 | Thermal TaN | 90% | 25 | 90% | 25 | 28 |
| 1 | PECVD Ta | 8% | 3 | 40% | 15 | 38 |
| Totals | | | 48 | | 140 | 316 |

TABLE 4

| Film | Material | Sidewall Coverage | Sidewall Thickness (Å) | Bottom Coverage | Bottom Thickness (Å) | Upper Surface Thickness (Å) |
|---|---|---|---|---|---|---|
| 5 | PECVD Ta | 8% | 20 | 40% | 100 | 250 |
| 4 | Thermal TaN | 90% | 25 | 90% | 25 | 28 |
| 3 | PECVD Ta | 8% | 3 | 40% | 15 | 38 |
| 2 | Thermal TaN | 90% | 25 | 90% | 25 | 28 |
| 1 | PECVD Ta | 8% | 3 | 40% | 15 | 38 |
| Totals | | | 76 | | 180 | 382 |

In still another example of an embodiment of the present invention, thermal CVD is used to deposit a metal nitride or insulating diffusion barrier while ionized PVD is used to deposit a metal layer. The film stack consists of about 28 Å TaN/200 Å Ta on the upper surface of a fluorinated or non-fluorinated dielectric substrate. The feature sidewalls have a corresponding thickness of about 25 Å TaN/20 Å Ta, and the conformality and sidewall step coverage of the film stack is about 20%. The bottom step coverage is about 64%. this example is further presented in Table 5.

wafer bias may be varied to provide more or less directionality to increase sidewall coverage.

With respect to depositing the electrically resistive diffusion barrier layers, any of ionized PVD, thermal CVD or plasma enhanced CVD may be used. However, for these barrier layers, high conformality may be more desirable to ensure even diffusion barrier properties across the wafer topography, and small upper surface thickness. Thermal CVD is capable of up to 100% conformality. Ionized PVD and plasma enhanced CVD direct more particles to the

TABLE 5

| Film | Material | Sidewall Coverage | Sidewall Thickness (Å) | Bottom Coverage | Bottom Thickness (Å) | Upper Surface Thickness (Å) |
|---|---|---|---|---|---|---|
| 2 | I-PVD Ta | 10% | 20 | 60% | 120 | 200 |
| 1 | Thermal TaN | 90% | 25 | 90% | 25 | 28 |
| Totals | | | 45 | | 145 | 228 |

With respect to the ionized PVD, plasma enhanced CVD and thermal CVD discussed herein, numerous literature is available regarding the deposition parameters, gases and source precursors, and target materials and configurations that can be employed to deposit the layers discussed above. It is well within the ordinary skill of one in the art of interconnect fabrication to employ appropriate deposition parameters and materials to practice the present invention.

In the above discussion, ionized PVD, thermal CVD and plasma enhanced CVD have been discussed for depositing the alternating metal and electrically resistive diffusion barrier layers. In general, for depositing a metal layer, plasma enhanced CVD or ionized PVD are most suitable for obtaining the thicknesses that optimize the diffusion barrier stack. The plasma enhanced CVD and ionized PVD processes produce poor conformality. Generally, they achieve sidewall step coverage of no more than about 10%. For the metal layers that function as contact facilitation layers, for example tantalum interlayers, thickness is only required at the feature bottom. As stated above, the metal interlayer needs to be thick enough to establish a conductive layer at the bottom contact between the two diffusion barrier layers so that there are metal electronic states to tunnel to and from. While that thickness may be as thin as a monolayer, it is more likely at least two monolayers. Most likely, the thickness at the bottom of the feature should be about 5–20 Å. The thickness of the metal interlayers is less critical on the sidewalls of the features. In fact, it is desirable to minimize the thickness of the sidewalls so that more copper can be deposited in the features. This can be accomplished by using a low step coverage method for depositing the metal interlayers, where the sidewall thickness can be thinner. Plasma enhanced CVD and ionized PVD are low step coverage methods that can achieve that sidewall thickness minimization. For a terminal metal layer, if the thickness at the bottom and sidewalls of the surface features are not thick enough, then the copper morphology may be poor. Thus, it may be desirable to provide thicker sidewall coverage for a terminal metal layer as opposed to a metal interlayer. The parameters used in the plasma enhanced CVD or the ionized PVD may be adjusted for the terminal layer to provide sidewall coverage that is thicker or thinner than another layer. For example, where a single CVD chamber is used for applying all of the liner layers, the plasma density may be varied to deposit more or less metal on the sidewalls, or the feature bottom than the feature sidewalls, and typically far greater thicknesses are achieved on the top surface adjacent the features. So although any of the three methods may be used, thermal CVD results in high conformality diffusion barrier layers that make the overall structure more robust against diffusion based degradation.

With respect to the dielectric upon which the diffusion barrier stack is deposited, exemplary dielectrics familiar in the art of integrated circuit fabrication include oxides such as silicon oxides, fluorinated silicon oxides, porous silicon oxides, and carbon-doped silicon oxides; organosilicate glasses (OSG); spin-on glasses, such as SILK® or FLARE® (AlliedSignal Inc.); polymers, such as xerogels, aerogels, methyl silsesquioxane (MSQ), and hydrogen silsesquioxane (HSQ); and fluorinated amorphous carbon (CFx). As is known, aerogels and xerogels are classes of porous polymers which have a low dielectric constant and CFx is an amorphous carbon containing approximately 4 atomic percent fluorine. The dielectric is typically grown or deposited upon a substrate, which may be any typical substrate used in the fabrication of integrated circuits, including silicon, gallium arsenide, or tetraethylorthosilicate (TEOS).

In the practice of the present invention, the number of alternating metal and metal nitride layers, and the thicknesses of each layer, are determined by the properties ultimately desired in the overall structure. It is first determined what the first layer on the dielectric will be. Where fluorine or other mobile reactive species is available for reaction with a pure metal, such as where the substrate is fluorinated, then to avoid byproduct formation at the interface, the first layer deposited on the dielectric should be the diffusion barrier, such as an insulating silicon nitride or a refractory metal nitride. Where the dielectric does not include fluorine that is capable of forming a byproduct with a metal, such as where the dielectric is non-fluorinated, or where a fluorinated dielectric has been treated by some method that renders it nonreactive, then the first liner layer may be either a metal or diffusion barrier. Once the first layer is determined, the total barrier thickness, which would be the sum of all individual barrier layers, is determined according to the desired diffusion barrier properties for the overall structure. If the resulting contact resistance is greater than desired, it is then determined what the maximum thickness is for a single barrier layer that will allow a sufficient amount of current to pass through that layer. The total barrier thickness is then split into individual layers of thickness equal to or less than that maximum thickness, however many layers that may be, to provide essentially even thicknesses for each layer. These barrier layers are then provided with intervening metal layers to enable the tunneling to and from the barrier layers if tunneling is an effective conduction mechanism for the chosen barrier thickness. The thickness of the metal interlayers is determined by identifying the thickness needed at the feature bottom for the metal to function as a contact facilitation layer for the adjacent diffusion barrier layers. The terminal layers of the liner stack may be either a metal or a metal nitride, although generally it has been found that metals allow for a smoother copper overlayer than metal nitrides. Regardless, the terminal layer thickness is determined by identifying the thickness needed in the sidewalls of the features sufficient for the terminal layer to function as an interconnect metal stabilization layer. Having identified the deposition sequence for the liner stack and the thicknesses for each layer, a liner stack or diffusion barrier stack is formed integrated with a dielectric as an optimum liner in an interconnect structure. The overall structure has good electrical properties and is robust against diffusion based degradation.

While the above discussion includes examples related to tantalum and tantalum nitride, the present invention is applicable to any structure where diffusion barrier thickness dominates the contact resistance of the structure. By taking the overall diffusion barrier thickness required for the structure and dividing the barrier into thinner individual layers separated by intervening metal, and by utilizing appropriate deposition techniques, a superior overall structure is obtainable. Thus, the present invention is applicable to other refractory metal/refractory metal nitride liners, such as Ti/TiN or W/WN, and to non-conductive barrier layers such as $Si_3N_5$. Given the detailed discussion with respect to the Ta/TaN system, one skilled in the art can apply the present invention to the other like systems. Further, while copper wiring is predominantly used in current devices, the present invention applies to any now known or hereafter developed interconnect devices.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for forming a diffusion barrier stack integral with a dielectric material for use in an interconnect structure in which passage of current through the stack primarily occurs via tunneling, the method comprising:

providing a dielectric material having a topography including a top surface and at least one recessed surface feature comprising at least a sidewall and a bottom; and depositing a liner stack on the dielectric material topography comprising at least one refractory metal layer in alternating relation with at least one electrically resistive diffusion barrier layer, wherein each metal layer other than a terminal layer has a thickness at the feature bottom sufficient to function as a contact facilitation layer for the at least one diffusion barrier layer, and wherein each diffusion barrier layer has a thickness less than a thickness that substantially limits passage of tunneling current through the diffusion barrier layer, and a total thickness for the sum of the at least one diffusion barrier layer is sufficient to block passage of diffusing atoms from the at least one metal layer, the dielectric material topography or a subsequently applied interconnect layer.

2. The method of claim 1, wherein the terminal layer in the liner stack has a thickness at the feature sidewall sufficient to function as an interconnect stabilization layer.

3. The method of claim 1, wherein the at least one metal layer is deposited by plasma enhanced chemical vapor deposition.

4. The method of claim 1, wherein the at least one metal layer is deposited by ionized physical vapor deposition.

5. The method of clam 1, wherein the at least one diffusion barrier layer is deposited by thermal chemical vapor deposition.

6. The method of claim 1, wherein the diffusion barrier is an insulating material.

7. The method of claim 6, wherein the insulating material is silicon nitride.

8. The method of claim 1, wherein the metal is a refractory metal selected from the group of tantalum, tungsten and titanium.

9. The method of claim 1, wherein the metal is tantalum.

10. The method of claim 9, wherein each metal layer other than the terminal layer has a thickness at the feature bottom of about 5–20 Å.

11. The method of claim 1, wherein the dielectric material is fluorinated and a first layer on the dielectric material is a metal nitride diffusion barrier.

12. The method of claim 1, wherein the terminal layer in the liner stack is a metal terminal layer.

13. The method of claim 12, wherein the terminal layer is tantalum having a thickness at the feature sidewall of at least about 20 Å.

14. The method of claim 1, wherein the diffusion barrier is TaN and the thickness for the sum of the at least one diffusion barrier layer at the feature sidewall is about 5 Å to about 50 Å.

15. The method of claim 1, wherein depositing the liner stack includes at least two electrically resistive diffusion barrier layers separated by the at least one refractory metal layer.

16. The method of claim 15, wherein the at least two diffusion barrier layers are TaN and the thickness for the sum of the at least two diffusion barrier layers at the feature sidewall is about 5 Å to about 50 Å.

17. A method for forming a diffusion barrier stack integral with a dielectric material for use in an interconnect structure in which passage of current through the stack primarily occurs via tunneling, the method comprising:

providing a dielectric material having a topography including a top surface and at least one recessed surface feature comprising at least a sidewall and a bottom; and depositing a liner stack on the dielectric material topography comprising at least one refractory metal layer in alternating relation with at least one electrically resistive diffusion barrier layer, wherein each metal layer other than a terminal layer has a thickness at the feature bottom sufficient to function as a contact facilitation layer for the at least one diffusion barrier layer, and wherein each diffusion barrier layer has a thickness less than a thickness that substantially limits passage of tunneling current through the diffusion barrier layer, and a total thickness for the sum of the at least one diffusion barrier layer is sufficient to block passage of diffusing atoms from the at least one metal layer, the dielectric material topography or a subsequently applied interconnect layer, wherein the diffusion barrier is TaN and the thickness of each diffusion barrier layer at the feature sidewall is no greater than about 25 Å.

18. The method of claim 17, wherein depositing the liner stack includes at least two electrically resistive diffusion barrier layers separated by the at least one refractory metal layer.

19. The method of claim 18, wherein the thickness for the sum of the at least two diffusion barrier layers at the feature sidewall is about 5 Å to about 50 Å.

20. A method for forming a diffusion barrier stack integral with a dielectric material for use in a copper interconnect in which passage of current through the stack primarily occurs via tunneling, the method comprising:

providing a dielectric material having a topography including a top surface and at least one recessed surface feature comprising at least a sidewall and a bottom; and depositing a liner stack on the dielectric material topography comprising at least one refractory metal layer in alternating relation with at least one electrically resistive diffusion barrier layer, wherein a first layer on the dielectric material is the diffusion barrier layer if the dielectric material contains a mobile reactive species, and wherein a terminal layer in the liner stack is the refractory metal layer having a thickness at the feature sidewall sufficient to function as a copper stabilization layer, and wherein each metal layer other than the terminal layer has a thickness at the feature bottom sufficient to function as a contact facilitation layer for the at least one diffusion barrier layer, and wherein each diffusion barrier layer has a thickness less than a thickness that substantially limits passage of tunneling current through the diffusion barrier layer, and a total thickness for the sum of the at least one diffusion barrier layer is sufficient to block passage of diffusing atoms from the at least one metal layer, the dielectric material topography or a subsequently applied copper layer.

21. The method of claim 20, wherein the at least one metal layer is deposited by plasma enhanced chemical vapor deposition.

22. The method of claim 20, wherein the at least one metal layer is deposited by ionized physical vapor deposition.

23. The method of claim 20, wherein the at least one diffusion barrier layer is deposited by thermal chemical vapor deposition.

24. The method of claim 20, wherein the diffusion barrier is an insulating material.

25. The method of claim 24, wherein the insulating material is silicon nitride.

26. The method of claim 20, wherein the metal is a refractory metal selected from the group of tantalum, tungsten and titanium.

27. The method of claim 20, wherein the metal is tantalum.

28. The method of claim 27, wherein each metal layer other than the terminal layer has a thickness at the feature bottom of about 5–20 Å.

29. The method of claim 20, wherein the terminal layer is tantalum having a thickness at the feature sidewall of at least about 20 Å.

30. The method of claim 20, wherein the diffusion barrier is TaN and the thickness for the sum of the at least one diffusion barrier layer at the feature sidewall is about 5 Å to about 50 Å.

31. The method of claim 20, wherein the diffusion barrier is TaN and the thickness of each diffusion barrier layer at the feature sidewall is no greater than about 25 Å.

32. The method of claim 20, wherein depositing the liner stack includes at least two electrically resistive diffusion barrier layers separated by the at least one refractory metal layer.

33. The method of claim 32, wherein the at least two diffusion barrier layers are TaN and the thickness for the sum of the at least two diffusion barrier layers at the feature sidewall is about 5 Å to about 50 Å.

34. A method for forming a diffusion barrier stack integral with a dielectric material for use in a copper interconnect, the method comprising:

providing a dielectric material having a topography including a top surface and at least one recessed surface feature comprising at least a sidewall and a bottom;

depositing a liner stack on the dielectric material topography comprising at least one tantalum layer in alternating relation with at least one tantalum nitride resistive diffusion barrier layer, wherein a first layer on the dielectric material is the tantalum nitride if the dielectric material contains a mobile reactive species, and wherein a terminal layer in the liner stack is tantalum having a thickness at the feature sidewall sufficient to function as a copper stabilization layer, and wherein each tantalum layer other than the terminal layer has a thickness at the feature bottom sufficient to function as a contact facilitation layer for the at least one diffusion barrier layer, and wherein each tantalum nitride diffusion barrier layer has a thickness less than a thickness that substantially limits passage of current through the diffusion barrier layer, and a total thickness for the sum of the at least one diffusion barrier layer is sufficient to block passage of diffusing atoms from the at least one tantalum layer, the dielectric material topography or a subsequently applied copper layer.

35. The method of claim 34, wherein the at least one tantalum layer is deposited by plasma enhanced chemical vapor deposition.

36. The method of claim 34, wherein the at least one tantalum layer is deposited by ionized physical vapor deposition.

37. The method of claim 34, wherein the at least one tantalum nitride layer is deposited by thermal chemical vapor deposition.

38. The method of claim 34, wherein each tantalum layer other than the terminal layer has a thickness at the feature bottom of about 5–20 Å.

39. The method of claim 34, wherein the terminal layer has a thickness at the feature sidewall of at least about 20 Å.

40. The method of claim 34, wherein the thickness for the sum of the at least one diffusion barrier layer at the feature sidewall is about 5 Å to about 50 Å and the thickness of each diffusion barrier layer at the feature sidewall is no greater than about 25 Å.

41. The method of claim 34, wherein depositing the liner stack includes at least two tantalum nitride resistive diffusion barrier layers separated by the at least one tantalum layer.

42. The method of claim 41, wherein the thickness for the sum of the at least two diffusion barrier layers at the feature sidewall is about 5 Å to about 50 Å.

43. A diffusion barrier stack integral with a dielectric material for use in an interconnect structure in which passage of current through the stack primarily occurs via tunneling, the stack comprising:

a dielectric material having a topography including a top surface and at least one recessed surface feature comprising at least a sidewall and a bottom; and a liner stack comprising at least one refractory metal layer in alternating relation with at least one electrically resistive diffusion barrier layer on the dielectric material topography, wherein a terminal layer in the liner stack has a thickness at the feature sidewall sufficient to function as an interconnect stabilization layer, and wherein each metal layer other than the terminal layer has a thickness at the feature bottom sufficient to function as a contact facilitation layer for the at least one diffusion barrier layer, and wherein each diffusion barrier layer has a thickness less than a thickness that substantially limits passage of tunneling current through the diffusion barrier layer, and a total thickness for the sum of the at least one diffusion barrier layer is sufficient to block passage of diffusing atoms from the at least one metal layer, the dielectric material topography or a subsequently applied interconnect layer.

44. The stack of claim 43, wherein the diffusion barrier is an insulating material.

45. The stack of claim 44, wherein the insulating material is silicon nitride.

46. The stack of claim 43, wherein the metal is a refractory metal selected from the group of tantalum, tungsten and titanium.

47. The stack of claim 43, wherein the metal is tantalum.

48. The stack of claim 47, wherein the at least one metal layer other than the terminal layer each have a thickness at the feature bottom of about 5–20 Å.

49. The stack of claim 43, wherein the dielectric material is fluorinated and a first layer on the dielectric material is a metal nitride diffusion barrier.

50. The stack of claim 43, wherein the terminal layer in the liner stack is a metal terminal layer.

51. The slack of claim 43, wherein the terminal layer is tantalum having a thickness at the feature sidewall of at least about 20 Å.

52. The stack of claim 43, wherein the diffusion barrier is TaN and the thickness for the sum of the at least one diffusion barrier layer at the feature sidewall is about 5 Å to about 50 Å.

53. The stack of claim 43, wherein the diffusion barrier is TaN and the thickness of each diffusion barrier layer at the feature sidewall is no greater than about 25 Å.

54. The stack of claim 43, wherein the liner stack includes at least two electrically resistive diffusion barrier layers separated by the at least one refractory metal layer.

55. The stack of claim 54, wherein the at least two diffusion barrier layers are TaN and the thickness for the sum of the at least two diffusion barrier layers at the feature sidewall is about 5 Å to about 50 Å.

56. A diffusion barrier stack integral with a dielectric material for use in a copper interconnect, the stack comprising:

a dielectric material having a topography including a top surface and at least one recessed surface feature comprising at least a sidewall and a bottom; and a liner stack comprising at least one tantalum layer in alternating relation with at least one tantalum nitride resistive diffusion barrier layer on the dielectric material topography, wherein a first layer on the dielectric material is the tantalum nitride if the dielectric material contains a mobile reactive species, and wherein a terminal layer in the liner stack is tantalum having a thickness at the feature sidewall sufficient to function as a copper stabilization layer, and wherein each tantalum layer other than the terminal layer has a thickness at the feature bottom sufficient to function as a contact facilitation layer for the at least one diffusion barrier layer, and wherein each tantalum nitride diffusion barrier layer has a thickness less than a thickness that substantially limits passage of current through the diffusion barrier layer, and a total thickness for the sum of the at least one diffusion barrier layer is sufficient to block passage of diffusing atoms from the at least one tantalum layer, the dielectric material topography or a subsequently applied copper layer.

57. The stack of claim 56, wherein each tantalum layer other than the terminal layer has a thickness at the feature bottom of about 5–20 Å.

58. The stack of claim 56, wherein the terminal layer has a thickness at the feature sidewall of at least about 20 Å.

59. The stack of claim 56, wherein the thickness for the sum of the at least one diffusion barrier layer at the feature sidewall is about 5 Å to about 50 Å and the thickness of each diffusion barrier layer at the feature sidewall is no greater than about 25 Å.

60. The stack of claim 56, wherein the liner stack includes at least two tantalum nitride resistive diffusion barrer layers separated by the at least one tantalum layer.

61. The stack of claim 60, wherein the thickness for the sum of the at least two diffusion barrier layers at the feature sidewall is about 5 Å to about 50 Å.

* * * * *

UNITED STATES PATENT AND TRADEMARK OFFICE
CERTIFICATE OF CORRECTION

PATENT NO. : 6,508,919 B1  
DATED : January 21, 2003  
INVENTOR(S) : Licata et al.

It is certified that error appears in the above-identified patent and that said Letters Patent is hereby corrected as shown below:

Column 1,  
Line 21, reads "$WN_x$may be" and should read -- $WN_x$ may be --.  
Line 38, reads "fcaturcs" and should read -- features --.

Column 13,  
Line 47, reads "slack" and should read -- stack --.

Column 14,  
Line 50, reads "barrer" and should read -- barrier --.

Signed and Sealed this

Twenty-ninth Day of July, 2003

JAMES E. ROGAN  
*Director of the United States Patent and Trademark Office*